US011744115B2

(12) United States Patent
Zhao

(10) Patent No.: US 11,744,115 B2
(45) Date of Patent: Aug. 29, 2023

(54) PIXEL DEFINING LAYER HAVING COLUMN PORTIONS IN A SPACE BETWEEN TWO ADJACENT COLUMNS OF SUBPIXEL APERTURES AND SPACING APART BY MULTIPLE PAIRS OF ADJACENT ROW PORTIONS RESPECTIVELY IN MULTIPLE ROWS

(71) Applicant: BOE TECHNOLOGY GROUP CO., LTD., Beijing (CN)

(72) Inventor: Dejiang Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 346 days.

(21) Appl. No.: 17/322,055

(22) Filed: May 17, 2021

(65) Prior Publication Data

US 2021/0273030 A1 Sep. 2, 2021

Related U.S. Application Data

(63) Continuation of application No. 15/761,383, filed as application No. PCT/CN2017/102905 on Sep. 22, 2017, now Pat. No. 11,031,444.

(30) Foreign Application Priority Data

Apr. 27, 2017 (CN) .......................... 201710289732.0

(51) Int. Cl.
*H01L 27/32* (2006.01)
*H10K 59/122* (2023.01)
(Continued)

(52) U.S. Cl.
CPC ............ *H10K 59/122* (2023.02); *B41J 3/407* (2013.01); *H10K 59/173* (2023.02);
(Continued)

(58) Field of Classification Search
CPC ... H10K 59/122; H10K 59/353; H10K 71/611
See application file for complete search history.

(56) References Cited

U.S. PATENT DOCUMENTS

2008/0036374 A1 2/2008 Okano
2013/0168653 A1 7/2013 Nam et al.
(Continued)

FOREIGN PATENT DOCUMENTS

CN 103187539 A 7/2013
CN 104183622 A 12/2014
(Continued)

OTHER PUBLICATIONS

International Search Report & Written Opinion dated Jan. 25, 2018, regarding PCT/CN2017/102905.
(Continued)

*Primary Examiner* — Anh D Mai
(74) *Attorney, Agent, or Firm* — Intellectual Valley Law, P.C.

(57) ABSTRACT

A display panel having a pixel defining layer defining subpixel apertures of subpixels is provided. The pixel defining layer is a unitary structure including column portions and row portions. A respective row portion is between two adjacent subpixel apertures that are in a same column and respectively from two adjacent rows. A respective column portion is in a space between two adjacent columns of subpixel apertures, spacing apart multiple pairs of adjacent row portions respectively in multiple rows. A respective row portion includes a depression part configured to allow fluid communication of an ink solution between the two adjacent subpixel apertures in the same column and respectively from the two adjacent rows. A minimum height of the depression part relative to a base substrate is less than a minimum
(Continued)

height of a column portion adjacent to the respective row portion relative to the base substrate.

20 Claims, 11 Drawing Sheets

(51) Int. Cl.
  *B41J 3/407* (2006.01)
  *H10K 59/173* (2023.01)
  *H10K 59/35* (2023.01)
  *H10K 71/00* (2023.01)
  *H10K 71/60* (2023.01)
  *H10K 50/11* (2023.01)
  *H10K 50/15* (2023.01)
  *H10K 50/17* (2023.01)
  *H10K 59/12* (2023.01)

(52) U.S. Cl.
  CPC ........... *H10K 59/353* (2023.02); *H10K 71/00* (2023.02); *H10K 71/611* (2023.02); *H10K 50/11* (2023.02); *H10K 50/15* (2023.02); *H10K 50/17* (2023.02); *H10K 59/1201* (2023.02)

(56) References Cited

U.S. PATENT DOCUMENTS

| | | |
|---|---|---|
| 2014/0346468 A1 | 11/2014 | Kim |
| 2016/0043150 A1 | 2/2016 | Liu et al. |
| 2016/0351632 A1 | 12/2016 | Iguchi et al. |
| 2016/0359112 A1 | 12/2016 | Wang et al. |
| 2017/0047383 A1 | 2/2017 | Hsin |
| 2019/0044077 A1 | 2/2019 | Zhang |

FOREIGN PATENT DOCUMENTS

| | | |
|---|---|---|
| CN | 104241313 A | 12/2014 |
| CN | 104299968 A | 1/2015 |
| CN | 104465671 A | 3/2015 |
| CN | 105206643 A | 12/2015 |
| CN | 205542786 U | 8/2016 |
| CN | 106449717 A | 2/2017 |

OTHER PUBLICATIONS

First Office Action in the Chinese Patent Application No. 201710289732.0, dated Apr. 19, 2019; English translation attached.

Second Office Action in the Chinese Patent Application No. 201710289732.0, dated Nov. 13, 2019; English translation attached.

Notice of Allowance in the U.S. Appl. No. 15/761,383, dated Feb. 11, 2021.

Non-Final Office Action in the U.S. Appl. No. 15/761,383,, dated Oct. 2, 2020.

Response to Non-Final Office Action in the U.S. Appl. No. 15/761,383, dated Oct. 29, 2020.

Restriction Requirement in the U.S. Appl. No. 15/761,383, dated Jun. 8, 2020.

Response to Restriction Requirement in the U.S. Appl. No. 15/761,383, dated Jun. 24, 2020.

FIG. 19G

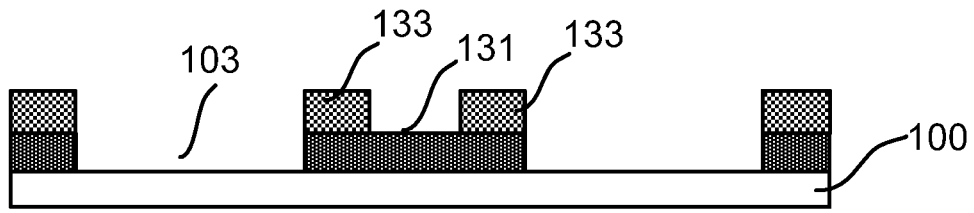

FIG. 20

```
Provide an array substrate having a pixel-
defining layer having a pixel-defining layer
including at least one groove
```
↓
```
Form a hole-injection layer and a hole
transporting layer overlying an electrode
layer in each subpixel region defined by
the pixel-defining layer
```
↓
```
Form one type of light-emitting layer
overlying the hole transporting layer in
some subpixel regions using liquid ink
dripping into at least one groove and
flowing from the at least one groove to the
corresponding subpixel regions
```

PIXEL DEFINING LAYER HAVING COLUMN PORTIONS IN A SPACE BETWEEN TWO ADJACENT COLUMNS OF SUBPIXEL APERTURES AND SPACING APART BY MULTIPLE PAIRS OF ADJACENT ROW PORTIONS RESPECTIVELY IN MULTIPLE ROWS

CROSS-REFERENCE TO RELATED APPLICATION

This application is a continuation of U.S. application Ser. No. 15/761,383, filed Sep. 22, 2017, which is a national stage application under 35 U.S.C. § 371 of International Application No. PCT/CN2017/102905, filed Sep. 22, 2017, which claims priority to Chinese Patent Application No. 201710289732.0, filed Apr. 27, 2017, the contents of which are incorporated by reference in the entirety.

TECHNICAL FIELD

The present invention relates to display technology, more particularly, to a display panel a display apparatus having the same display panel and a method of making the display panel.

BACKGROUND

The state-or-art display includes at least two major types: active Light-Emitting Display and passive Liquid Crystal Display (LCD). An active light-emitting display panel includes an array substrate and a cover. The display panel includes a plurality of light-emitting subpixels while the cover is disposed on top of the light-emitting subpixels on the array substrate. In specific, each light-emitting subpixel, or simply subpixel, includes multiple layers sequentially disposed on the array substrate, including a first electrode, a light-emitting film, and a second electrode. The light-emitting film also is a multilayer structure formed by sequentially disposing a hole-injection layer (on the first electrode), a hole-transporting layer, a light-emitting layer, and an electron-transporting layer. One method of forming the light-emitting layer in the subpixel is vapor deposition. Another method is inkjet printing method by depositing the light-emitting layer in liquid form.

Inkjet printing typically requires a printing device having multiple nozzles disposed at corresponding positions above multiple subpixel regions. Each nozzle needs to perform ink-dripping multiple times while moving from one subpixel to next. The processes are difficult to control especially for making display panels having high PPI numbers and often have a non-uniformity issue in drops of ink after a period of continuous inkjet printing process.

SUMMARY

In an aspect, the present disclosure provides a display panel. The display panel includes a base substrate and a pixel-defining layer on a surface on the base substrate to define multiple subpixel regions arranged in multiple rows with each subpixel region surrounded by part of the pixel-defining layer. The pixel-defining layer includes one or more grooves. Each groove includes a container portion partially surrounded by an edge portion. The container portion is at a first height above the surface and the edge portion being at a second height greater than the first height relative to the surface. The edge portion of each groove includes one or more gaps to allow the container portion to connect to one or more subpixel regions respectively in one or two rows at one or both sides of the groove.

Optionally, the container portion is made of a material having opposite polarity to that of an ink material to be dripped into thereof.

Optionally, the display panel further includes an ink material layer disposed in one or more subpixel regions. The ink material layer has an opposite polarity of that of the container portion.

Optionally, the one or more subpixel regions connected to one container portion are of a same color.

Optionally, the subpixel regions of different color are separately connected to different container portions in respective different grooves.

Optionally, the pixel-defining layer includes a first type of groove in an elongated shape extended along a length of a row of subpixel regions and located either between an edge of the base substrate and a first row of subpixel regions or between a last row of subpixel regions and an opposing edge of the base substrate. The first type of groove is connected to subpixel regions of a same color in corresponding first or last rows of subpixel regions.

Optionally, the pixel-defining layer includes a second type of groove in an elongated shape extended along a length of a row of subpixel regions and located between at least two adjacent rows of subpixel regions. The second type of groove is connected to subpixel regions of a same color in corresponding two adjacent rows of subpixel regions.

Optionally, the pixel-defining layer includes a second type of groove in an elongated shape extended along a length of a row of subpixel regions and located between any two adjacent rows of subpixel regions. Any two adjacent second type of grooves are alternately connected to subpixel regions of different color. Optionally, each second type of groove includes at least two sub-grooves and a wall separating any two adjacent sub-grooves. Each sub-groove is connected to subpixel regions of a same color.

Optionally, each second type of groove includes multiple sub-grooves having a same number of subpixel regions in one row of subpixel regions. Each sub-groove is connected to two corresponding subpixel regions of a same color respectively in two adjacent rows of subpixel regions.

Optionally, the container portion is about 1 µm-2 µm above the surface in each corresponding subpixel region connected to the container portion.

Optionally, each container portion includes a width along a direction perpendicular to the rows of subpixel regions. The width is greater than a width of each subpixel region along a direction of the rows of subpixel regions.

Optionally, each of the one or more gaps includes a width substantially equal to a width of each subpixel region along a direction of the rows of subpixel regions.

Optionally, the container portion includes a curved surface with a largest height relative to the surface at a location proximate to a center thereof.

Optionally, the multiple subpixel regions include a first subpixel region of a first color, a second subpixel region of a second color, and a third subpixel region of a third color. The first subpixel region is covered by a first light-emitting material of the first color, the second subpixel region is covered by a second light-emitting material of the second color, and the third subpixel region is covered by a third light-emitting material of the third color. The third light-emitting material of the third color overlays the first light-emitting material and the second light-emitting material.

Optionally, the first light-emitting material and the second light-emitting material are respectively formed by dripping an ink material of the first color in liquid form and an ink material of the second color in liquid form in separate container portions of two different grooves respectively connected to the first subpixel region of the first color and the second subpixel region of the second color.

In another aspect, the present disclosure provides a display apparatus including a display panel described herein.

In another aspect, the present disclosure provides a method of fabricating a display panel. The method includes forming a pixel-defining layer on a surface on a base substrate to define multiple subpixel regions arranged in multiple rows with each subpixel region surrounded by part of the pixel-defining layer. The pixel-defining layer includes one or more grooves. Each groove includes a container portion partially surrounded by an edge portion. The container portion is at a first height above the surface and the edge portion is at a second height greater than the first height relative to the surface. The edge portion of each groove includes one or more gaps to allow the container portion to connect to one or more subpixel regions respectively in one or two rows at one or both sides of the groove.

Optionally, the method of forming a pixel-defining layer includes forming a pixel-defining film on the surface on the base substrate and removing part of material of the pixel-defining film to form a container portion in each of the one or more grooves. Each container portion has the first height relative to the surface.

Optionally, the method of forming a pixel-defining layer includes forming a first layer of material with a thickness equal to the first height on the surface. Additionally, the method of forming a pixel-defining layer includes forming a second layer of material on the first layer around edges thereof to form the container portion made by the first layer of material surrounded by the edge portion made by the second layer of material and the first layer of material. Moreover, the method of forming a pixel-defining layer includes forming one or more gaps in the edge portion to have the the container portion connected to one or more subpixel regions respectively in one or two rows at one or both sides of the groove. The one or more subpixel regions correspond to subpixels of a same color.

Optionally, the method of fabricating the display panel further includes dripping an ink material in liquid form into the container portion and flowing the ink material through the one or more gaps in the edge portion into corresponding one or more subpixel regions respectively in one or two rows at one or both sides of the groove.

Optionally, the method of fabricating the display panel further includes forming a hole-injection layer and a hole-transporting layer overlying an electrode layer in each subpixel region. A total height of the hole-injection layer and a hole-transporting layer is less than a difference between the second height and the first height. Furthermore, the method includes forming one type of light-emitting layer overlying the hole-transporting layer in some subpixel regions by dripping a liquid ink material into at least one groove and having the liquid ink material to flow from the at least one groove to corresponding one or more subpixel regions to form one or more subpixels for emitting light of a same color.

Optionally, the method of forming one type of light-emitting layer includes dripping a red light-emitting ink material in liquid form into a corresponding container portion of a groove that is connected to the some subpixel regions and drying the red light-emitting ink material therein to a solid form, and dripping a green light-emitting ink material in liquid form into another corresponding container portion of a groove that is connected to the some other subpixel regions, and drying the green light-emitting ink material therein to a solid form. The corresponding container portion and the another corresponding container portion belong to different grooves that are separated in the pixel-defining layer.

Optionally, the method of forming one type of light-emitting layer includes forming a blue light-emitting layer in some subpixel regions comprises by vapor deposition to deposit a blue light-emitting material in each corresponding subpixel region or to deposit a blue light-emitting material overlying each subpixel region including those having the red ink material and the green ink material dried therein.

In another aspect, the present disclosure provides a display panel comprising columns of subpixels of a first color, columns of subpixels of a second color, and columns of subpixels of a third color alternately arranged, wherein subpixels in a same column are subpixels of a same color; and subpixels respectively in two adjacent columns are subpixels of different colors; wherein the display panel comprises a pixel defining layer defining subpixel apertures of subpixels in the display panel; a respective subpixel aperture has an elongated shape; a width of the respective subpixel aperture along a column direction is greater than a width of the respective subpixel aperture along a row direction; the pixel defining layer is a unitary structure comprising column portions and row portions; a respective row portion is between two adjacent subpixel apertures that are in a same column and respectively from two adjacent rows; a respective column portion is in a space between two adjacent columns of subpixel apertures, spacing apart multiple pairs of adjacent row portions respectively in multiple rows; the respective row portion comprises a depression part configured to allow fluid communication of an ink solution between the two adjacent subpixel apertures in the same column and respectively from the two adjacent rows; and a minimum height of the depression part relative to a surface of a base substrate is less than a minimum height of a column portion adjacent to the respective row portion relative to the surface of the base substrate.

Optionally, the respective row portion further a first side part and a second side part respectively on two sides of the depression part; the first side part, the depression part, and the second side part are consecutively arranged along the row direction; a minimum height of the respective row portion relative to the surface of the base substrate is less than a minimum height of a column portion adjacent to the respective row portion relative to the surface of the base substrate; and a height of the respective row portion relative to the surface of the base substrate decreases from the first side part toward the depression part, and decreases from the second side part toward the depression part.

Optionally, the first side part, the second side part, and the depression part are parts of the unitary structure comprising a same pixel defining insulating material.

Optionally, the first side part, the second side part, the depression part, and the respective column portion are parts of the unitary structure comprising a same pixel defining insulating material.

Optionally, multiple row portions in the same column and multiple subpixel apertures respectively of multiple subpixels of a same color in the same column are alternately arranged along the column direction; and the multiple row portions respectively comprise multiple depression parts configured to allow fluid communication of an ink solution among the multiple subpixel apertures respectively of the multiple subpixels of the same color in the same column.

Optionally, the display panel further comprises a first light emitting material layer arranged in a plurality of first light emitting material columns; a respective first light emitting material column of the plurality of light emitting material columns is in subpixel apertures in a same column; two adjacent first light emitting material columns are spaced apart by the respective column portion; and an orthographic projection of the respective first light emitting material column on the base substrate at least partially overlaps with an orthographic projection on the base substrate of the depression part of the respective row portion between two adjacent subpixel apertures that are in the same column and respectively from two adjacent rows.

Optionally, the display panel further comprises a second light emitting material layer on a side of the first light emitting material layer away from the base substrate; and an orthographic projection of the second light emitting material layer on the base substrate covers orthographic projections of the subpixel apertures defined by the pixel defining layer on the base substrate, and covers orthographic projections of the row portions and the column portions of the pixel defining layer on the base substrate.

Optionally, the first light emitting material layer comprises one or more of a hole injection layer, a hole transport layer, and a light emitting layer; and the second light emitting material layer comprises an electron transport layer.

Optionally, the orthographic projection of the respective first light emitting material column on the base substrate at least partially overlaps with each of orthographic projections of the multiple depression parts of the multiple row portions in the same column on the base substrate.

Optionally, a bottom surface of at least a portion of the depression part is in contact with a top surface of at least a portion of an anode with respect to the surface of the base substrate.

Optionally, at least a portion of the depression part is on a top surface of an anode.

Optionally, the subpixel apertures comprise at least one connecting aperture; two row portions are respectively on two opposite sides of a connecting subpixel aperture; the two row portions respectively comprise two depression parts arranged along the column direction; and the two depression parts are configured to allow fluid communication of the ink solution between the connecting subpixel aperture and other two adjacent subpixel apertures in the same column, the connecting subpixel aperture and the two adjacent subpixel apertures being respectively from the three consecutively adjacent rows.

Optionally, the display panel further comprises a plurality of anode columns; a respective anode column of the plurality of anode columns is underneath subpixel apertures in a same column, a portion of the respective anode column being underneath the respective row portion between two adjacent subpixel apertures that are in the same column and respectively from two adjacent rows.

Optionally, the display panel further comprises a plurality of anodes respectively in a plurality of subpixels; wherein a top surface of at least a portion of a respective anode of the plurality of anodes is in contact with a bottom surface of at least a portion of the row portion, and in contact with a bottom surface of at least a portion of the respective column portion.

Optionally, the display panel further comprises a unitary cathode layer extending throughout a plurality of subpixels; and an orthographic projection of the unitary cathode layer on the base substrate covers orthographic projections of the subpixel apertures defined by the pixel defining layer on the base substrate, and covers orthographic projections of the row portions and the column portions of the pixel defining layer on the base substrate.

Optionally, a width along the row direction of the respective column portion decreases from a side closer to the base substrate to a side away from the base substrate; and/or a width along the column direction of the respective row portion decreases from a side closer to the base substrate to a side away from the base substrate.

Optionally, a thickness of the respective column portion is greater than a thickness of a first light emitting material layer in the respective subpixel aperture.

Optionally, a thickness of the depression part is greater than a thickness of a first light emitting material layer in the respective subpixel aperture.

Optionally, the display panel further comprises a hole injection layer comprising a plurality of hole injection blocks respectively in a plurality of subpixel apertures and spaced apart from each other by the pixel defining layer; a hole transport layer comprising a plurality of hole transport blocks respectively in the plurality of subpixel apertures and spaced apart from each other by the pixel defining layer; a red light emitting layer comprising a plurality of red light emitting blocks respectively in a plurality of red subpixel apertures and spaced apart from each other by the pixel defining layer; and a green light emitting layer comprising a plurality of green light emitting blocks respectively in a plurality of green subpixel apertures and spaced apart from each other by the pixel defining layer.

Optionally, the display panel further comprises a hole injection layer comprising a plurality of hole injection blocks respectively in a plurality of subpixel apertures and spaced apart from each other by the pixel defining layer; a hole transport layer comprising a plurality of hole transport blocks respectively in the plurality of subpixel apertures and spaced apart from each other by the pixel defining layer; a light emitting layer comprising a plurality of light emitting blocks respectively in the plurality of subpixel apertures and spaced apart from each other by the pixel defining layer; a unitary electron transport layer extending throughout a plurality of subpixels; and a unitary cathode layer extending throughout the plurality of subpixels.

BRIEF DESCRIPTION OF THE FIGURES

The following drawings are merely examples for illustrative purposes according to various disclosed embodiments and are not intended to limit the scope of the present invention.

FIGS. 19D-19G are schematic diagrams showing a process of forming a pixel-defining layer according to some embodiments of the present disclosure.

FIG. 20 is a flow chart of a method for fabricating an OLED device according to some embodiments of the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
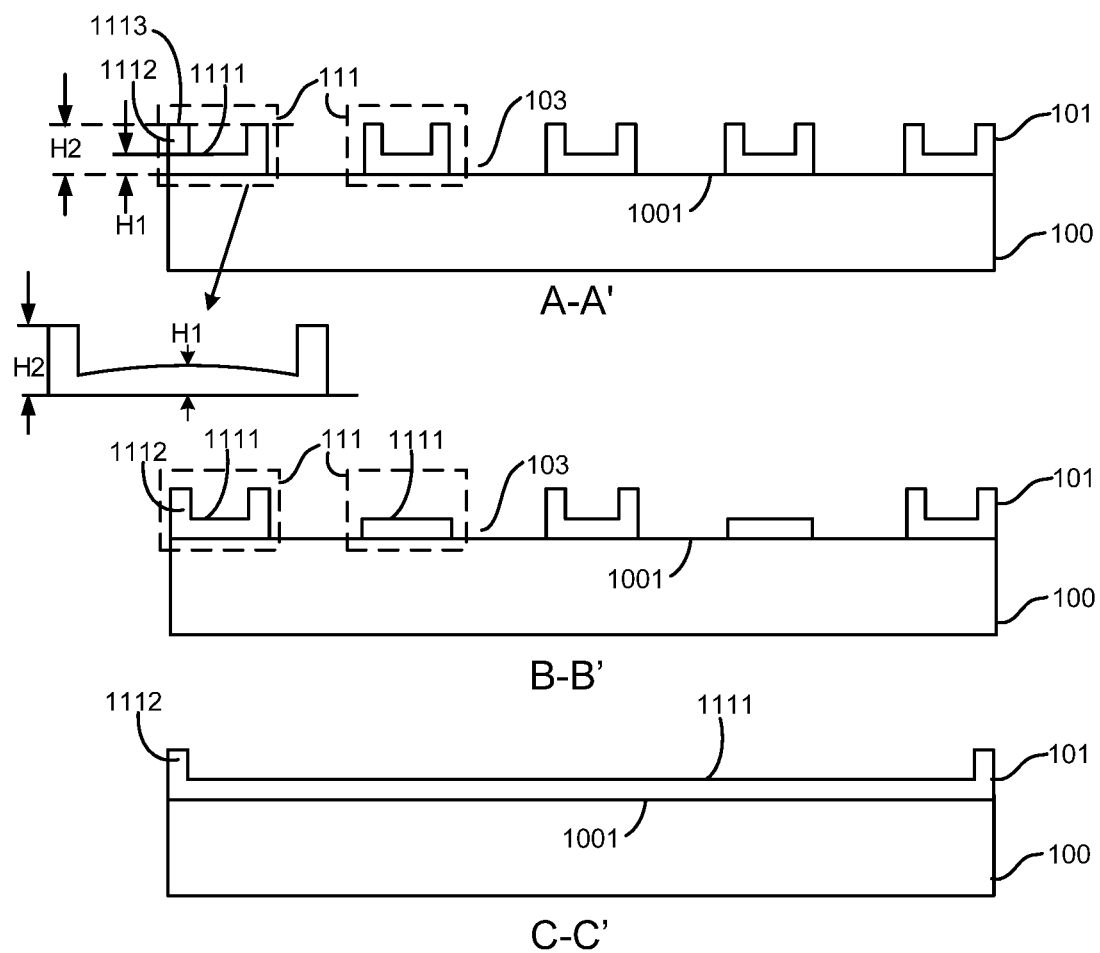
FIG. 1 is a schematic diagram of a structure of a display panel according to an embodiment of the present disclosure.
Figure 2:
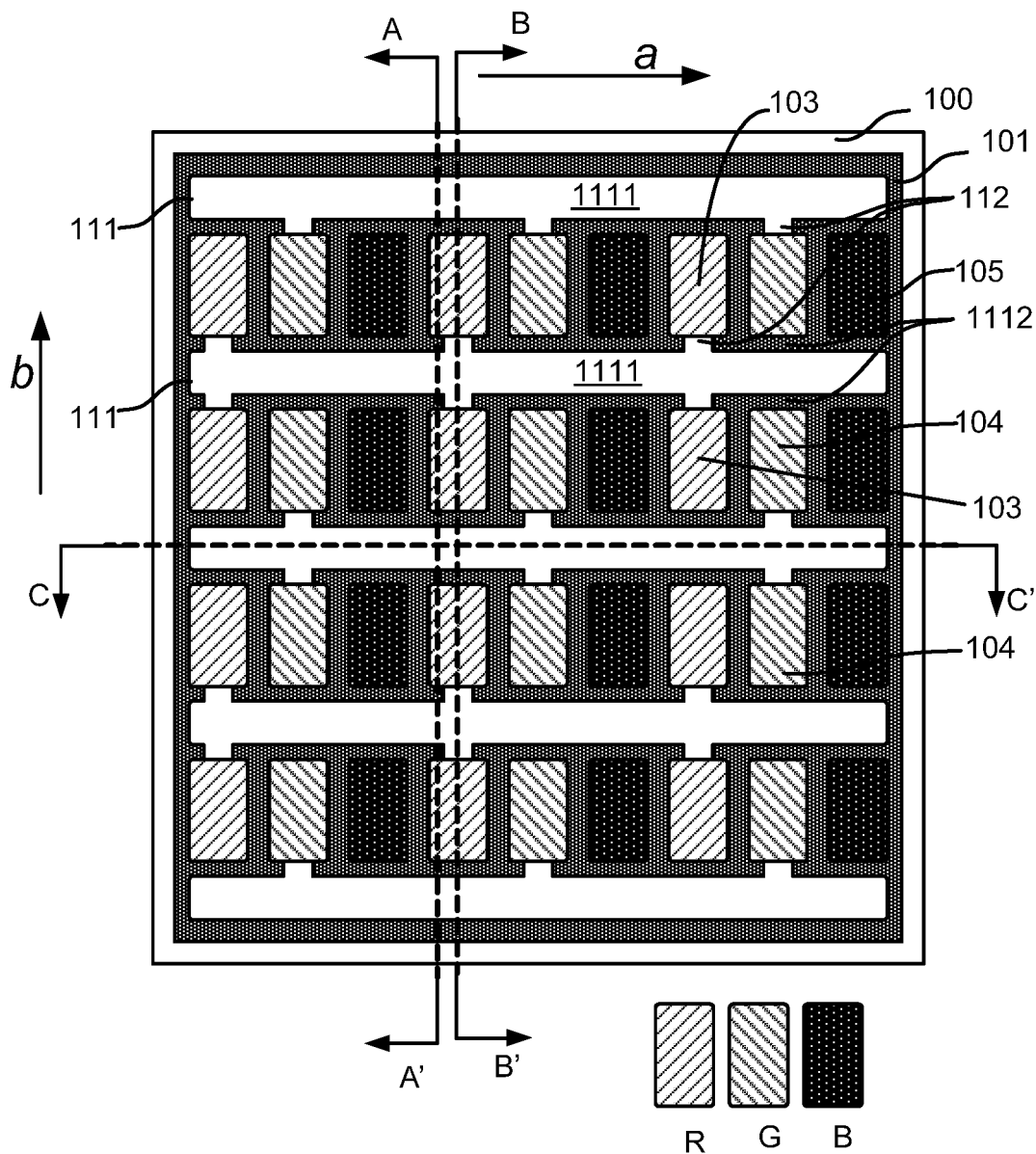
FIG. 2 is a top view of the display panel of FIG. 1 according to an embodiment of the present disclosure.

In an aspect, the present disclosure provides a display panel for fabricating an active light-emitting display apparatus. FIG. 1 is a schematic diagram of a structure of a display panel according to an embodiment of the present disclosure. FIG. 1 shows three cross-section views along A-A' plane, B-B' plane, and C-C' plane of FIG. 2 which shows a top view of the display panel. Referring to FIG. 1 and FIG. 2, the display panel includes a base substrate 100, a pixel-defining layer 101 formed on a surface 1001 on the base substrate 100. Optionally, the surface 1001 is part of the base substrate 100. Optionally, the surface 1001 is a surface of a layer of material formed on the base substrate 100. For example, the layer of material is an electrode layer or others. The pixel-defining layer 101 divides the surface 1001 to multiple subpixel region 103 arranged in multiple rows along direction a. Of course, the row of subpixels optionally can be along direction b, as shown in FIG. 2. Each subpixel region 103 is surrounded by a portion of the pixel-defining layer 101. Between any two adjacent rows of subpixel regions, the pixel-defining layer 101 includes one or more grooves 111 having an elongated shape along the direction a. Each groove 111 includes a container portion 1111 (e.g., a bottom of the groove 111) having a height H1 over the surface 1001 of the base substrate 100. The height H1 is set to be greater than zero. Each groove 111 also includes an edge portion 1112 at least partially surrounding the container portion 1111. The edge portion 1112 has top surface 1113 with a height H2 relative to the surface 1001 of the base substrate 100, which is higher than the height H1 of the container portion 1111. Along the edge portion 1112, there are one or more gaps 112 formed at different positions to respectively have the container portion 1111 connected to some subpixel regions 103 in the two rows respectively at two sides of the groove 111. Three cross-section views shown in FIG. 1 illustrate some structure details of the groove in the pixel-defining layer including the container portion and edge portion in different directions.

Optionally, the subpixel regions 103 that are connected to the container portion 1111 are those subpixels configured to be filled with one type of light-emitting material for emitting light of a same color. The subpixel regions filled with a same type of light-emitting material are called subpixels of a same color herein. A subpixel region filled with a red light-emitting layer is thus called a red subpixel region, marked with R in FIG. 2. A subpixel region filled with a green light-emitting layer is thus called a green subpixel region, marked G. A subpixel region filled with a blue light-emitting layer is thus called a blue subpixel region, marked B. Optionally, these subpixels are arranged in a same order from one row to another and two subpixels of a same color are opposed to each other across the groove 111, as seen in FIG. 2. Accordingly, two gaps 112 are formed in the two opposing edge portions 1112 to have the two subpixel regions, e.g., 103, of a same color connected together to the container portion 1111.

In some embodiments, the pixel-defining layer 101 includes grooves 111 for respectively making each corresponding container portion 1111 to connect to at least two subpixel regions 103 of a same color in two adjacent rows divided by the groove 111. Assuming that all grooves 111 are extended through the whole length along the direction a between two rows of subpixel regions 103, the container portion 1111 of each groove 111 is configured to connect to all subpixel regions 103 of a same color in the two rows divided by the groove. With such a structure of pixel-defining layer, an inkjet printing process can be performed to drip a proper amount of one type of light-emitting ink material in liquid form in one time into the container portion 1111, which is set to be higher than the subpixel region 103, and to flow by gravity into all subpixel regions 103 to form a light-emitting film required for emitting light of a same color. In other words, one nozzle needs to perform ink-dripping one-time per groove and nearly ⅓ of a plurality of subpixel regions of a same color in two rows can be provided with the light-emitting ink material. This substantially reduces complexity for controlling the inkjet printing process, and reduces the number of ink-dripping per nozzle and extending the time period between one ink-dripping and another, substantially avoiding the issue of non-uniformity in drops of ink due to frequent ink-dripping operation.

The pixel-defining layer 101 also includes some portions located between each two adjacent subpixel regions (e.g., 103 and 104) in a same row and some portions located between each subpixel region 105 and side edge of the display panel, these portions all belong to part of the same pixel-defining layer 101 and have a same height of H2 above the surface 1001 on the base substrate 100 as the edge portion 1112 mentioned above.

Optionally, the base substrate 100 including a surface 1001 can be made by a material selected from glass, quartz, metal, and polymer. Optionally, one or more layers of other materials providing a surface 1001 are formed on the base substrate 100. Optionally, the pixel-defining layer 101 or at least the container portion 1111 of the grooves 111 is made by a material that has an opposite polarity of a light-emitting ink material to be dripped inside the subpixel region so that the light-emitting ink material can substantially free to flow in the container portion 1111 and flow from the container portion 1111 into the subpixel region 103. Afterward, a drying process is performed for solidify the light-emitting ink material inside the subpixel region 103. The opposite polarity between the container portion and the ink material allows substantially no residue ink material being left in the container portion 1111.

Referring to FIG. 1, the container portion 1111 has a height H1 above the surface 1001 of the base substrate 100. Optionally, the height H1 is set in a range of 1 μm to 2 μm. This height H1 is to ensure that the ink material in the container portion 1111 can properly flow into the subpixel region 103 by gravity. Optionally, as shown in an inset portion of FIG. 1, the container portion 1111 is in a concaved curve with a middle region having a largest height of H1. Optionally, the largest height H1 at the middle region is set to about 1 μm with lower surrounding regions being gradually reduced to the same level as the surface 1001 The height H2 represents total thickness of the pixel-defining layer 101 relative to the surface 1001 of the base substrate 100. The difference between H2 and H1 determines a depth of the groove 111. The depth of the groove 111 is related to a designed volume to hold certain amount of to-be-dripped-in liquid ink material which will flow from the groove container portion 1111 to the corresponding subpixel regions 103.

Referring to FIG. 2, red subpixel regions 103, green subpixel region 104, and blue subpixel regions 105 are also marked as R, G, B, respectively. Different subpixels of different color connected to container portions of different grooves. For example, all subpixel regions R in first two adjacent (first and second) rows are connected to a container portion of a groove 111 and all green subpixel regions G in next two adjacent (second and third) rows are separately connected to a container portion of a different (neighbor) groove 111'. Similar layout can be extended to all rows of the subpixel regions arranged periodically in the display panel by the same pixel-defining layer. Therefore, a red ink material in liquid form dripped from an inkjet nozzle into the groove 111 can flow into all corresponding red subpixel regions 103 connected to the container portion of the groove 111. A green ink material in liquid form can also be formed similarly into all corresponding green subpixel regions 104 connected to the container portion of the next groove 111'. A subsequent drying process can solidify the ink material to solid form in each respective subpixel region to form the corresponding red light-emitting layer and green light-emitting layer therein. In the embodiment, all blue subpixel regions B are connected to neither groove. The blue light-emitting layer can be deposited into the blue subpixel regions 105 using vapor deposition method after the red light-emitting layer and the green light-emitting layer are respectively formed in all the red subpixel regions 103 and all green subpixel regions 104. Optionally, the blue light-emitting layer can even be formed as a common layer over all subpixel regions so that no need for making any groove with container portion to connect to any blue subpixel region.

Referring to FIG. 2, the gaps 112 in the edge portion 1112 can be formed at a same level as the container portion 1111, e.g., the same height as a surface of the container portion 1111 above the surface 1001 of the base substrate 100. Alternatively, as shown in FIG. 3, the gaps 112 in the edge portion 1112 are formed at a same level as the subpixel region 103 or 104.

Figure 3:
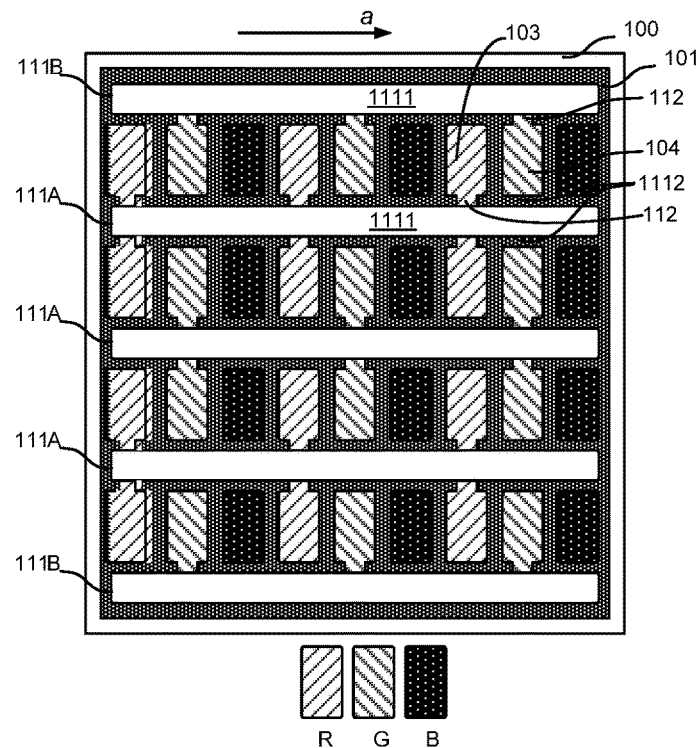
FIG. 3 is a top view of the display panel of FIG. 1 according to another embodiment of the present disclosure.

Referring to FIG. 3, a first groove 111A having an elongated shape is formed between two adjacent rows of subpixel regions 103 and a second groove 111B having a similar elongated shape is formed in parallel at one side of multiple first grooves 111A. Each first groove 111A has a container portion connected to all subpixel regions of one color selected from red and green in two adjacent rows next to the groove 111A. Each adjacent first groove 111A has a separate container portion connected to all subpixels of an alternate one selected from red and green in two adjacent rows next to the particular first groove 111A. Each second groove 111B has a separate container portion connected to all subpixel regions in one row having one color that are not connected to a neighboring first groove 111A. In an example, the second groove 111B at the top of the figure has a container portion 1111 connected to all green subpixel regions 104 in the first row. The next first groove 111A has a container portion 1111 connected to all red subpixel regions 103 in the first row and in the second row. The next first groove 111A has a container portion connected to all green subpixel regions 104 in the second row and in the third row, and so on. Lastly, a second groove 111B is to ensure that the subpixel regions that are not connected by the previous first groove 111A will be connected to a separate container portion. Optionally, each groove is extended to reach all subpixel regions up to a full row across the base substrate 100 to simplify the ink-dripping process for printing red and green light-emitting layers to all red and green subpixel regions.

Figure 4:
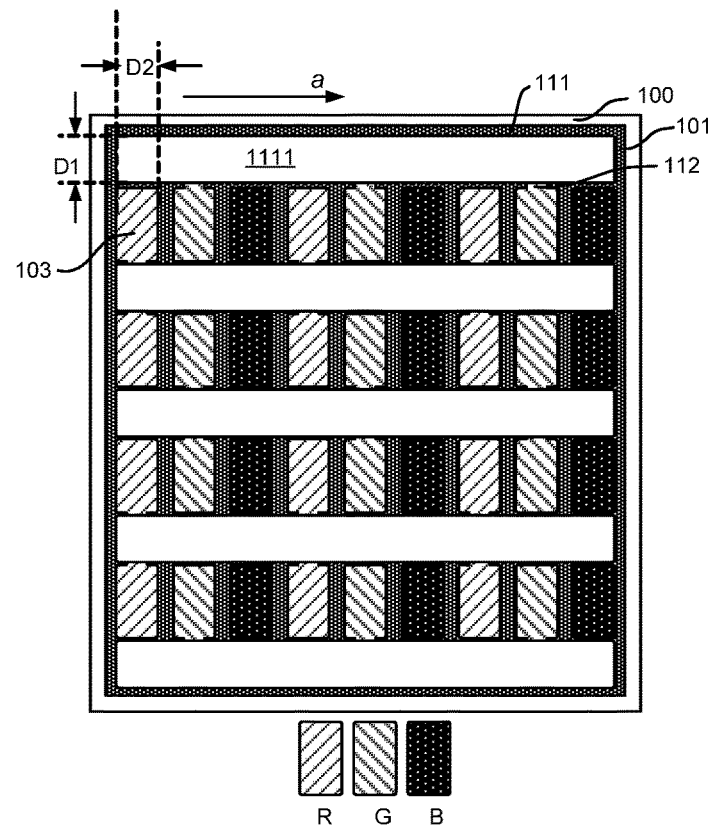
FIG. 4 is a top view of the display panel of FIG. 1 according to another embodiment of the present disclosure.

FIG. 4 shows another top view of the display panel of FIG. 1. Referring to FIG. 4, a width D1 of a groove 111 between two opposing edge portions in the pixel-defined layer 101 is set to be greater than a width of D2 of a subpixel region in the row direction a. The wider groove ensures that ink-dripping from inkjet printing nozzle into the container portion 1111 is more accurate and reliable.

Figure 5:
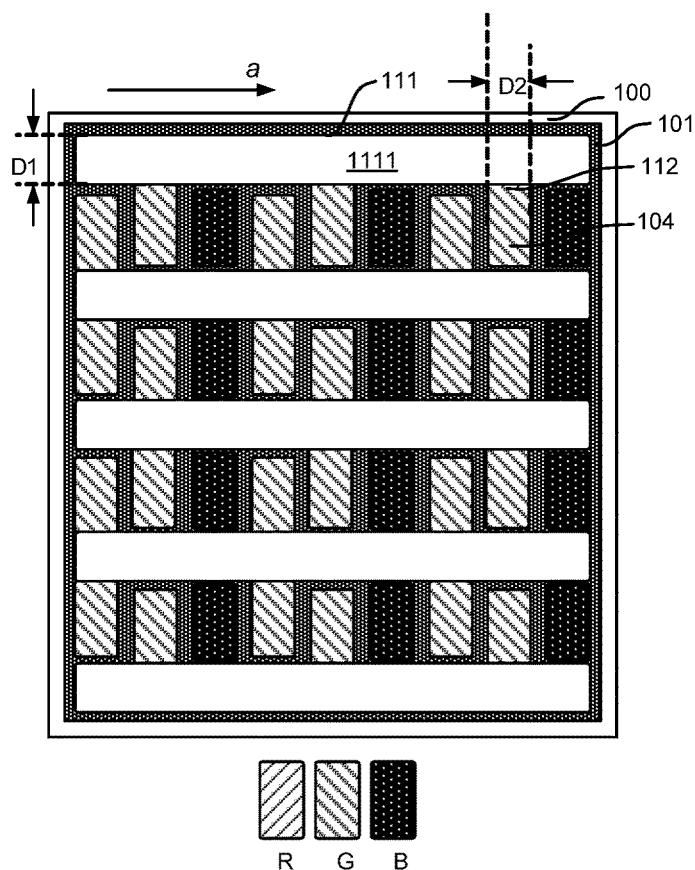
FIG. 5 is a top view of the display panel according to another embodiment of the present disclosure.

FIG. 5 shows a top view of the display panel according to another embodiment of the present disclosure. Referring to FIG. 5, the width of the gap 112 is made to be substantially the same as the width D2 of the corresponding subpixel region 104 along the direction a of rows of subpixel regions so that the light-emitting ink material can easily flow from the container portion 1111 of the groove 111 into the subpixel region 104.

Figure 6:
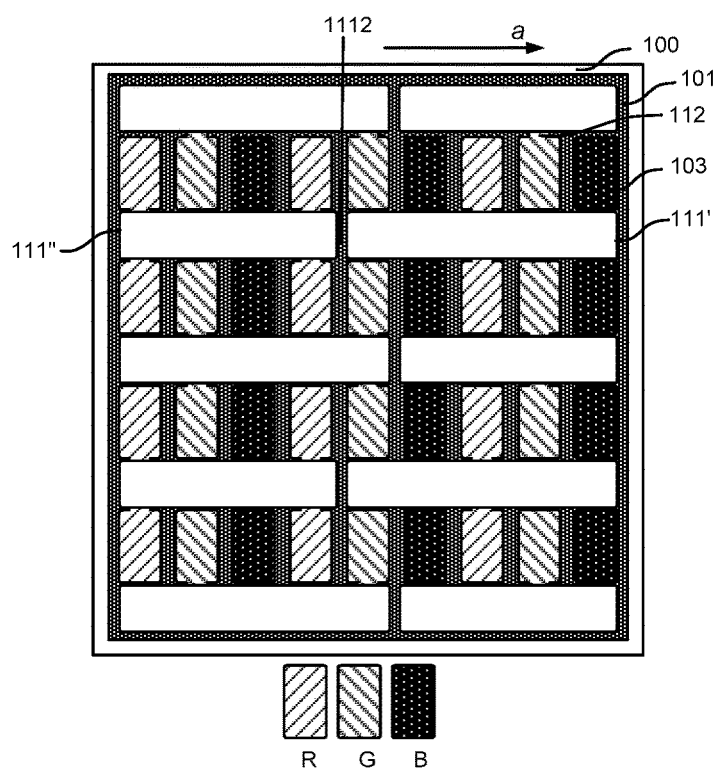
FIG. 6 is a top view of the display panel according to another embodiment of the present disclosure.
Figure 7:
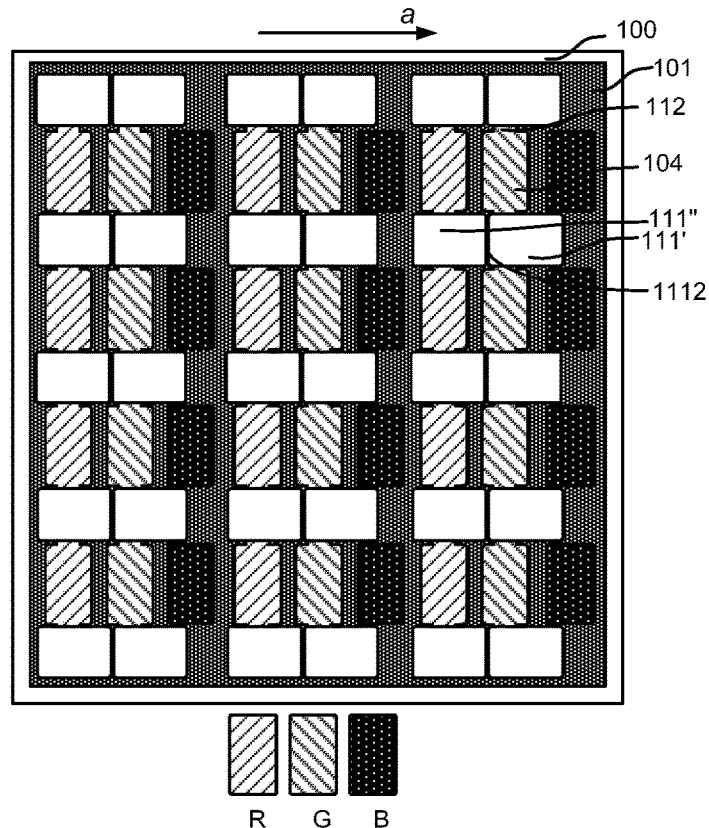
FIG. 7 is a top view of the display panel according to another embodiment of the present disclosure.
Figure 8:
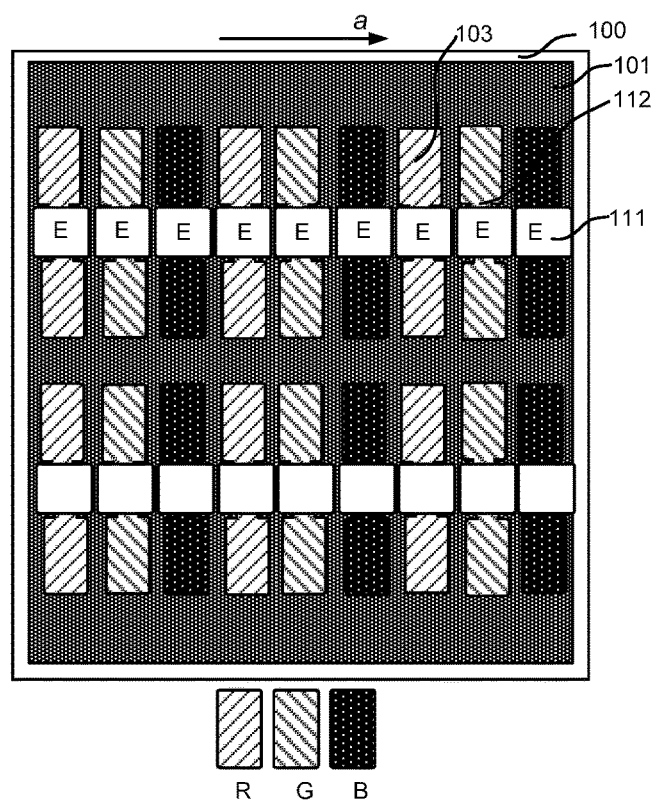
FIG. 8 is a top view of the display panel according to another embodiment of the present disclosure.

Optionally, between each two adjacent rows of subpixel regions, the pixel-defining layer 101 can be laid with two or more grooves 111. FIG. 6 is a top view of the display panel according to another embodiment of the present disclosure. FIG. 7 is another top view of the display panel according to yet another embodiment of the present disclosure. Both FIG. 6 and FIG. 7 show examples of two or more grooves being laid in between two rows of subpixel regions. An edge portion 1112 is disposed between two neighboring grooves 111' and 111". In the embodiment, each of the two or more grooves between two rows of subpixel regions is still at least connected to two opposing subpixel regions of a same color respectively at the two rows. FIG. 8 is yet another top view of the display panel according to still another embodiment of the present disclosure. FIG. 8 shows an example of the display panel configured with the number of grooves in the row direction a equal to a same number of subpixel regions in each row (or at least equal to total number of red subpixel regions plus green subpixel regions if the blue subpixel regions can be excluded). Here we call each of this type of groove as an E-groove. In this embodiment, each E-groove corresponds to two subpixel regions of a same color. Each row of E-grooves is able to connect to all red and green subpixel regions in two rows. But, for every two rows of subpixel regions, only one row of E-grooves is needed. For any above various groove layout structures in FIG. 2 through FIG. 8, each groove is correspondingly being supplied with an inkjet printing nozzle for dripping corresponding type of ink material in liquid form so that the ink material can flow into those subpixel regions connected respectively to the grooves.

Optionally, the subpixel region is defined as a rectangular shape as shown in FIG. 2 to FIG. 8 although other shapes can be set too. Optionally, the shape of groove in the pixel-defining layer is set as a rectangle with two longer sides along the row direction a, although other shapes such as circular shape, parallelogram shape, or even irregular shapes can be formed.

Figure 9:
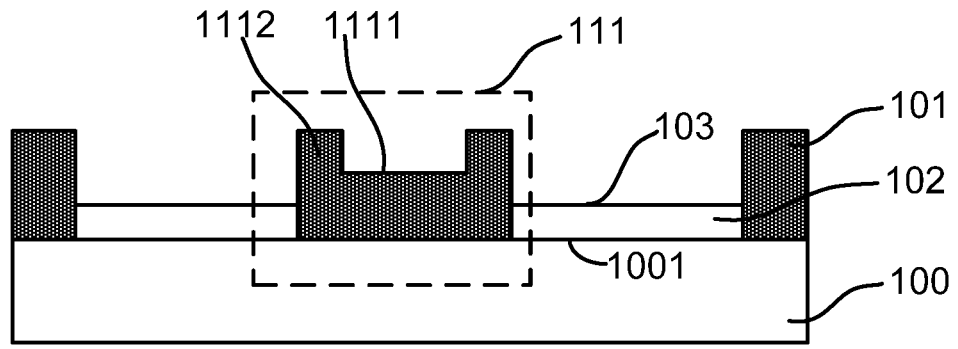
FIG. 9 is a schematic diagram of a structure of a display panel according to another embodiment of the present disclosure.

In some embodiments, an electrode layer 102 formed on the surface 1001 of the base substrate 100 is an anode. Optionally, the electrode layer includes multiple anodes. Referring to FIG. 1, the anode is in a stripe shape with one anode being set for each row or each column of subpixel regions. FIG. 9 shows a schematic diagram of a structure of a display panel according to another embodiment of the present disclosure. In FIG. 9, each anode 102 is formed as a block associated with each corresponding subpixel region 103. In the embodiment, the pixel-defining layer 101 is formed directly on the surface of the base substrate. For an OLED device, if a first electrode, anode 102, is set in a stripe shape, a second electrode, i.e., cathode, correspondingly should be set in a stripe shape in a perpendicular direction. If the anode is set as a block electrode, the cathode should be set as a plane electrode.

Figure 10:
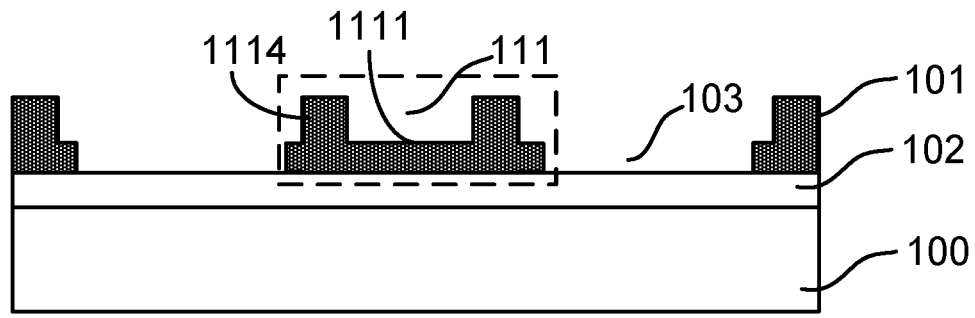
FIG. 10 is a schematic diagram of a structure of a display panel according to yet another embodiment of the present disclosure.

FIG. 10 is a schematic diagram of a structure of a display panel according to yet another embodiment of the present disclosure. FIG. 10 shows that the pixel-defining layer 101 has an edge portion 1114 with a different cross-sectional shape compared to the edge portion 1112 in FIG. 1. Optionally, the cross-sectional shape of the edge portion of the groove formed in the pixel-defining layer can be rectangular shape, a step shape, a trapezoid shape, and other shapes, depending on specific patterning process for forming the pixel-defining layer on the base substrate. The patterning process can be a one-step process or can be a two-step process. The two-step process involves a first step for forming the container portion 1111 including an extra part under the edge portion 1114 at a same level (FIG. 10), and a second step for forming edge portion 1114 above the extra part including both side and top surface. Optionally, the material used in the two steps may be different or the same.

Figure 11:
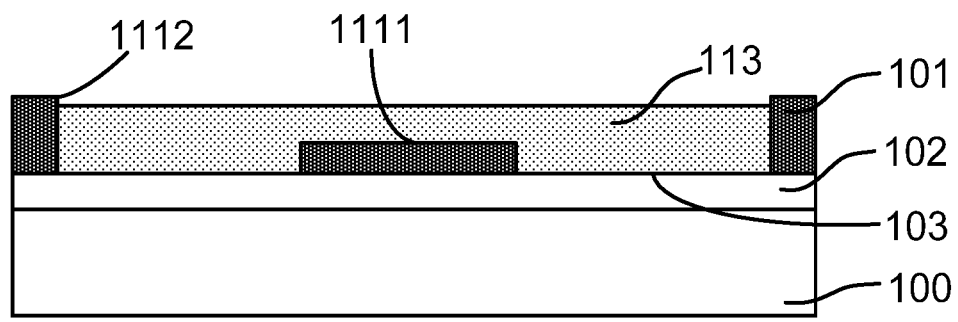
FIG. 11 is a schematic diagram of dripping an ink material into the groove of display panel according to some embodiments of the present disclosure.
Figure 12:
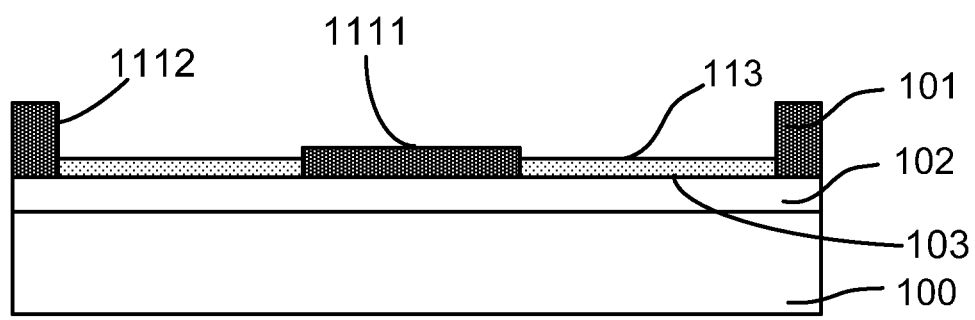
FIG. 12 is a schematic diagram of dripping an ink material into the groove of display panel according to some embodiments of the present disclosure.
Figure 13:
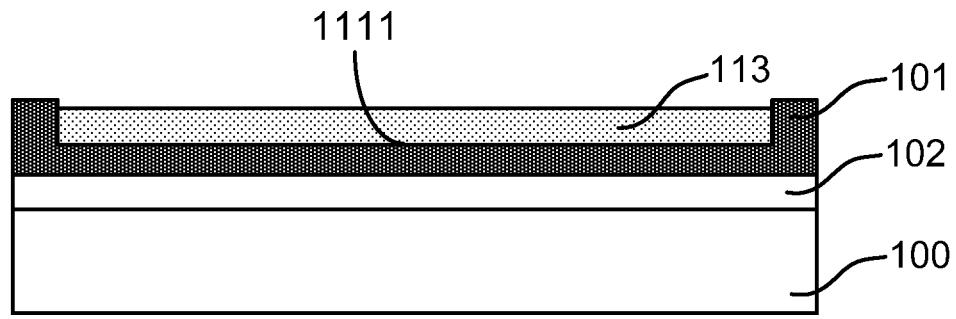
FIG. 13 is a schematic diagram of dripping an ink material into the groove of display panel according to some embodiments of the present disclosure.
Figure 14:
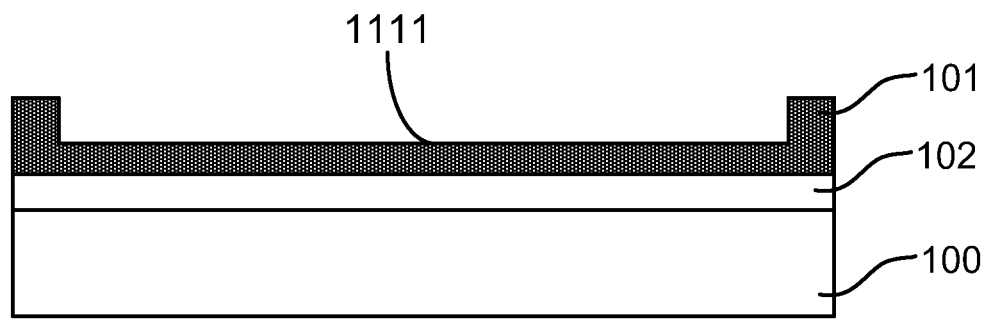
FIG. 14 is a schematic diagram of dripping an ink material into the groove of display panel according to some embodiments of the present disclosure.

FIG. 11 through FIG. 14 illustrates schematically a process of using the display panel described herein to dry the liquid ink material into solid form therein. Referring to FIG. 11, ink material 113 in liquid form is dripped in a groove and fills both the container portion 1111 of the groove and the corresponding subpixel regions 103 connected to the container portion 1111. Referring to FIG. 12, after most portions of the ink material flows into the subpixel regions and any residue of the ink material left at the container portion 1111 also evaporates, the remaining portion of the ink material 113 only covers the subpixel regions 103. Thicknesses of several structures of the pixel-defining layer 101 associated with above process can be measured by a white light interferometer relative to the base substrate 100. It can be found that the thickness of the edge portion 1112 is greater than the container portion 1111. The latter is further greater than the thickness of the subpixel region 103. By measuring the thickness of the container portion 1111 before and after ink-dripping, one can know if any residue ink material 113 still is left in the groove. Referring to FIG. 13, an example shows that some ink material 113 is still left on the container portion 1111 in the groove. FIG. 14 shows an example that after flowing and evaporating, no residue of ink material 113 is left on the container portion 1111.

Figure 15:
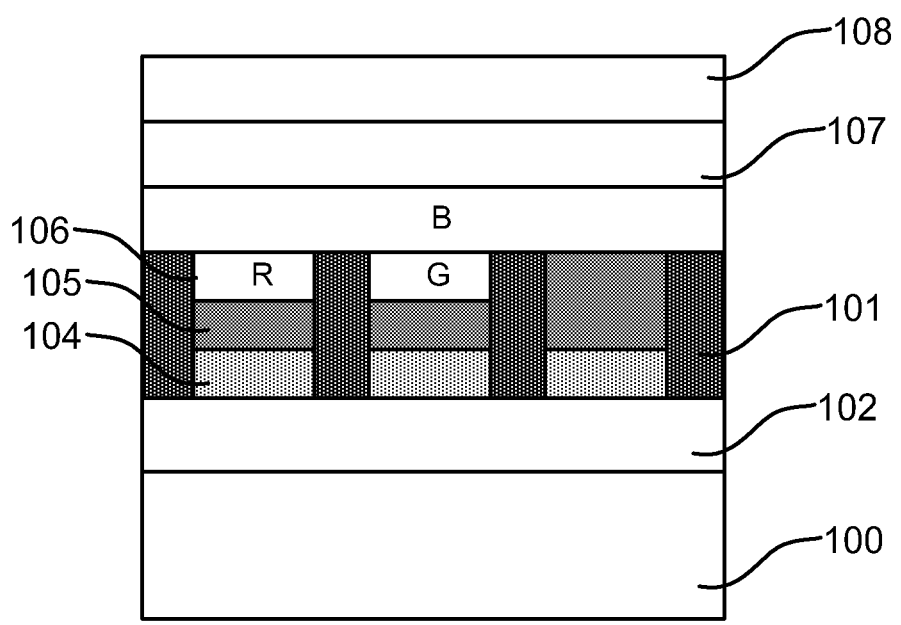
FIG. 15 is a schematic diagram of a structure of a light-emitting display device according to an embodiment of the present disclosure.

In another aspect, the present disclosure provides a light-emitting display device including the display panel described herein (as illustrated in any one of FIG. 1 to FIG. 14). FIG. 15 is a schematic diagram of a structure of the light-emitting display device according to an embodiment of the present disclosure. Referring to FIG. 15, the light-emitting display device includes the display panel with all features described above, and also includes a hole-injection layer 104, hole-transporting layer 105, a light-emitting layer 106, an electron transporting layer 107, and another electrode 108. Provided the electrode 102 as an anode, the another electrode 108 is configured to be a cathode. Referring to FIG. 15, the light-emitting layer 106 includes a red light-emitting layer 1061, a green light-emitting layer 1062, and a blue light-emitting layer 1063. Optionally, a least one of the red light-emitting layer 1061, the green light-emitting layer 1062, and the blue light-emitting layer 1063 is formed in a subpixel region by dripping a proper type of light-emitting ink material in liquid form into a groove of a pixel-defining layer 101 and making the light-emitting ink material flowing into a corresponding subpixel region. Optionally, the hole-injection layer 104, the hole-transporting layer 105, the red light-emitting layer 1061, and the green light-emitting layer 1062 are all limited on corresponding subpixel regions defined by the pixel-defining layer 101. Optionally, the blue light-emitting layer 1063 is configured to be a commonly shared light-emitting layer. Optionally, the blue light-emitting layer 1063 is disposed over the red light-emitting layer 1061 and the green light-emitting layer 1062.

Referring to FIG. 15, since the blue light-emitting layer does not have to be disposed in a blue subpixel region, the hole transport layer 105 for the blue subpixel region can be formed with a bigger thickness than that of the hole transport layer 105 in either a red subpixel region or a green subpixel region.

Figure 16:
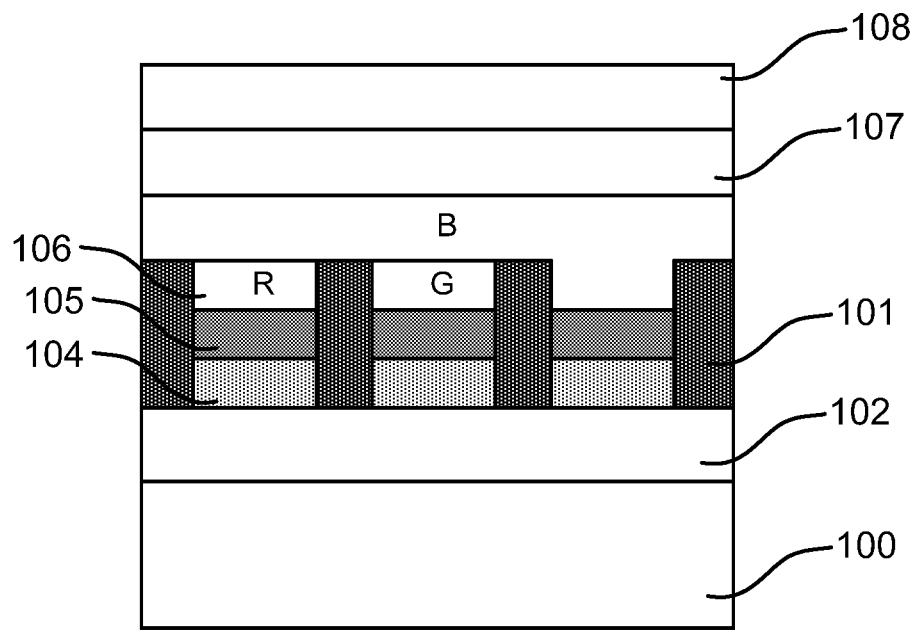
FIG. 16 is a schematic diagram of a structure of a light-emitting display device according to another embodiment of the present disclosure.

FIG. 16 is a schematic diagram of a structure of an OLED device according to another embodiment of the present disclosure. Referring to FIG. 16, unlike that in FIG. 15, in the OLED device a thickness of the hole-transporting layer 105 in the blue subpixel region equals to that of the hole-transporting layer in red subpixel region and that in the green subpixel region. The blue light-emitting layer 1063 covers the area above the blue subpixel region as well as a common area shared by both the red light-emitting layer 1061 and the green light-emitting layer 1062.

Figure 17:
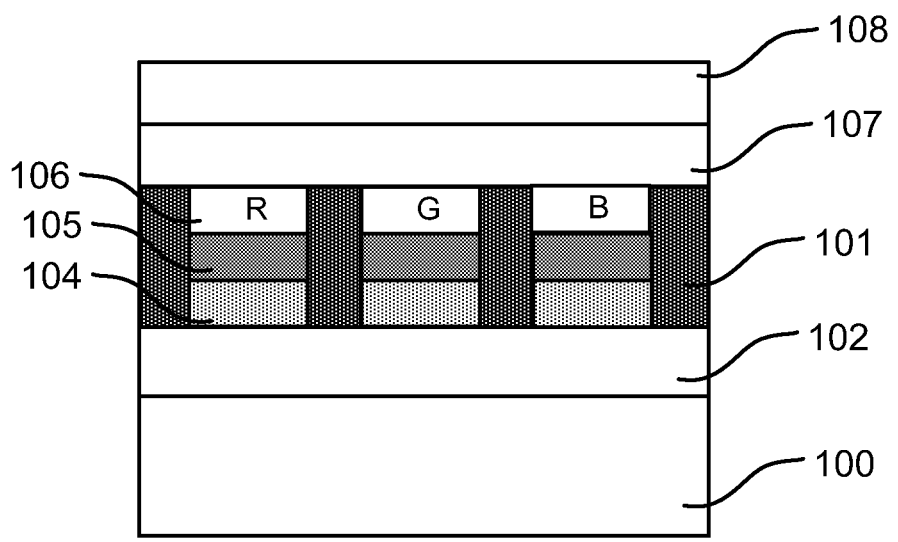
FIG. 17 is a schematic diagram of a structure of a light-emitting display device according to yet another embodiment of the present disclosure.

FIG. 17 shows another embodiment of the OLED device of the present disclosure. The difference between the embodiment of FIG. 17 and the embodiment of FIG. 15 is that the OLED device of FIG. 17 includes an independently formed blue light-emitting layer 1063 within each blue subpixel region. Of course, the diagrams shown in FIG. 15 through FIG. 17 are all examples, which should not unduly limit the scope of the claims. One of ordinary skill in the art would recognize many variations, alternatives, and modifications.

In another aspect, the present disclosure also provides a display apparatus including the OLED device described herein. In various implementations, the present disclosure provides the display apparatus as one selected from a smart phone, a tablet computer, a television, an image displayer, a laptop computer, a digital picture frame, a navigator, and any product or component having a function of display.

Figure 18:
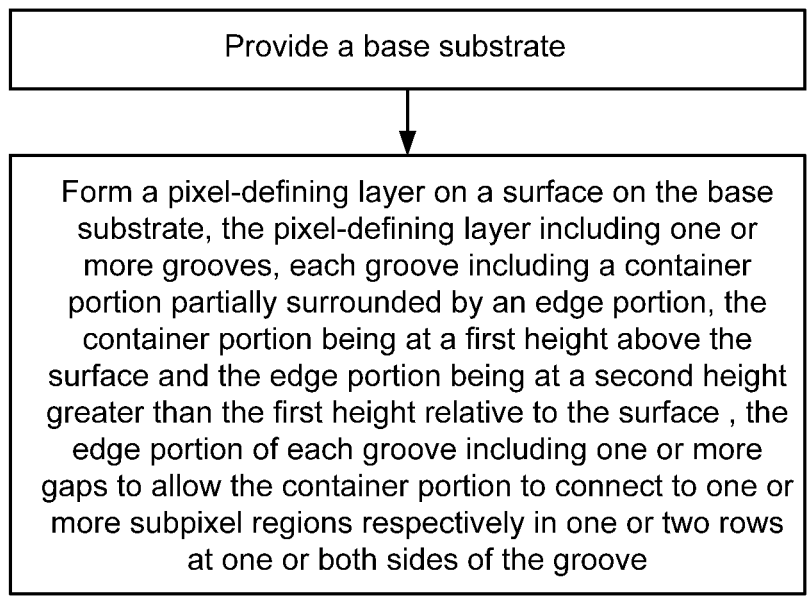
FIG. 18 is a flow chart of a method for fabricating a display panel according to some embodiments of the present disclosure.

In yet another aspect, the present disclosure provides a method for fabricating a display panel that is shown in any one of FIG. 1 to FIG. 14 and in the corresponding descriptions throughout the specification. Referring to FIG. 18, the method includes a process of providing a base substrate. Optionally, the base substrate is a glass substrate. Optionally, the base substrate is a substrate made by quartz, or metal, or polymer material. Additionally, the base substrate includes a surface. Optionally, the surface is part of the base substrate. Optionally, the surface is a part of a layer of material formed on the base substrate. For example, the layer of material is an electrode layer. Furthermore, the method includes a process of fabricating a pixel-defining layer on the surface on the base substrate. The pixel-defining layer is configured to divide the surface into multiple subpixel regions arranged in multiple rows. Each subpixel region includes a portion of the surface. Optionally, the portion of the surface includes an electrode layer. Between any two adjacent rows of subpixel regions, the pixel-defining layer includes one or more grooves. The groove has a container portion with a height level relative to the surface being set to be greater than the surface in the subpixel region. The container portion is partially surrounded by an edge portion which is at a height greater than the height of the container portion. In the embodiment, the edge portion has one or more gaps to allow the container portion to connect to at least two subpixel regions configured for emitting light of a same color and located respectively in the two rows of the subpixel regions divided by the groove. Optionally, the process of forming the pixel-defining layer includes one or more grooves between any two rows of subpixel regions, where each groove includes a container portion having a higher height than a top surface of the electrode layer over the base substrate, the container portion is connected to at least one subpixel regions located at one or both sides of the groove. Detail structural configurations of the pixel-defining layer can be found in the descriptions for FIG. 1 through FIG. 14 in the specification. These structure configurations provide a basis for forming at least one light-emitting layer in a subpixel region by dripping a proper type of ink material in liquid form in a groove and making the ink material in liquid form to flow into the corresponding subpixel region that is connected to a container portion of the groove through a gap in the edge portion.

Figure 19A:
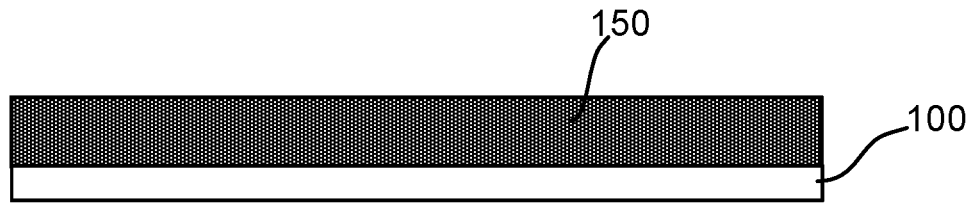
FIGS. 19A-19C are schematic diagrams showing a process of forming a pixel-defining layer according to some embodiments of the present disclosure.
Figure 19B:
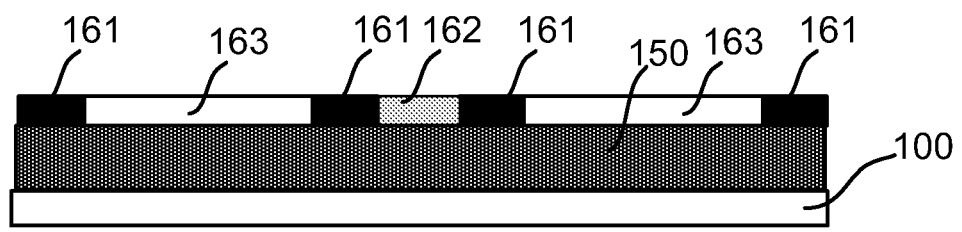
Figure 19C:
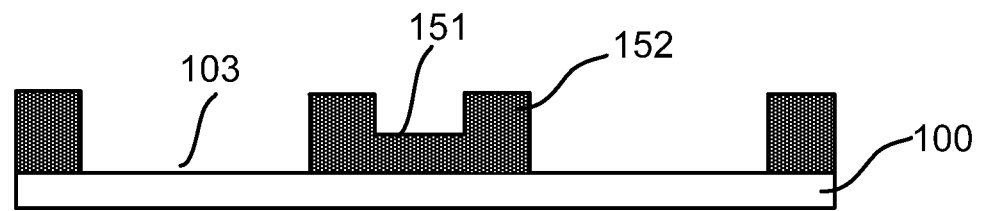
Figure 19D:
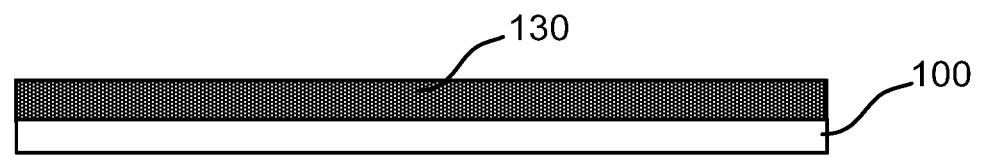

In an embodiment, the process of forming the pixel-defining layer includes forming a pixel-defining film overlying a surface on the base substrate and patterning the pixel-defining film to form the pixel-defining layer including one or more grooves. Optionally, a patterning process includes using a halftone mask or a gray-scale mask. Specifically, a layer of photoresist is formed on the pixel-defining film first. Then, in the layer of photoresist, a portion of complete removal, a portion of partial preservation, and a portion of complete preservation are formed using the halftone mask or grayscale mask. A first etching process then is performed in the portion of complete removal to remove some material over the subpixel regions. An ashing process is performed to remove photoresist in the portion of partial preservation over the container portion. A second etching process is performed to form each container portion the subpixel regions. The portion of complete preservation is left as an edge portion surrounding each container portion. The container portion includes one or more gaps formed in the edge portion to connect the container portion to one or more subpixel region. The subpixel region has zero height relative to the surface. The container portion has a first height above the surface, i.e., being higher than the subpixel region. The edge portion has a second height above the surface. The second height is greater than the first height. As shown in FIG. 19A to FIG. 19D, a pixel-defining layer is formed. Firstly, a pixel-defining film 150 is formed overlying a surface on the base substrate 100 (FIG. 19A). A layer of photoresist is formed overlying the pixel-defining film 150. The layer of photoresist includes a portion 163 of complete removal, a portion 162 of partial preservation, and a portion 161 of complete preservation (FIG. 19B). A first etching process is performed over the portion 163 of photoresist of complete removal to remove part of material of pixel-defining film 150 over the subpixel regions (FIG. 19C). An ashing process is performed to remove photoresist in the portion 162 of partial preservation (FIG. 19C). A second etching process is performed to remove partially material of pixel-defining film 150 thereof to form the container portion 151 and the subpixel regions 103 (FIG. 19D). As the portion of photoresist on the portion 161 of complete preservation is removed, the persevered portion of the pixel-defining film 150 forms the edge portion 152.

Figure 19E:
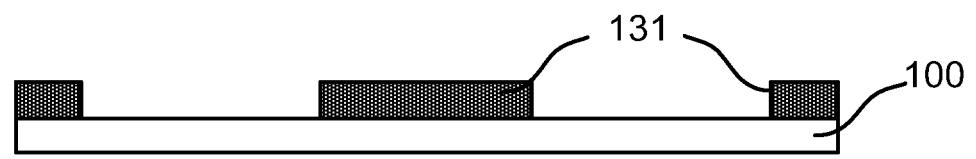
Figure 19F:
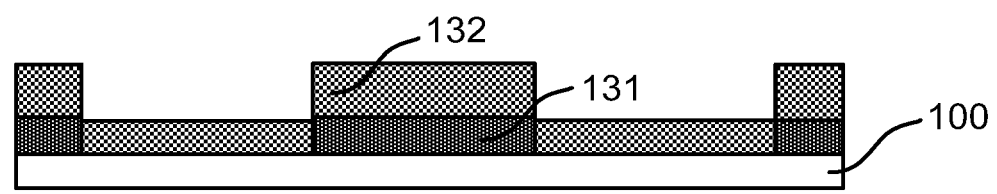

In another embodiment, the process of forming the pixel-defining layer includes forming a first layer of a pixel-defining material overlying a surface on the base substrate and patterning the first layer of the pixel-defining material to remove a portion of the pixel-defining material to form multiple subpixel regions. The remaining portion of the first layer includes a container portion and a portion for supporting an edge portion thereon. Then, the process of forming the pixel-defining layer includes forming a second layer of a pixel-defining material overlying both the subpixel regions and the remaining portion of the first layer. And, the process includes patterning the second layer of pixel-defining material to remove part of the second layer of the pixel-defining material from the subpixel regions and the container portion on the remaining portion of the first layer while keeping the edge portion on the remaining portion of the first layer. The patterning the second layer also includes removing part of the edge portion to form one or more gaps to connect the container portion to the subpixel regions. The first layer of pixel-defining material and the second layer of pixel-defining material can be the same or different material. As shown in FIG. 19E to FIG. 19H, a pixel-defining layer is formed. Firstly, a first layer 130 of pixel-defining material is formed on the base substrate 100 (FIG. 19E). A patterning process is performed in the first layer 130 of pixel-defining material to form subpixel regions 103 and remaining portion 131 of the first layer of pixel-defining material (FIG. 19F). A second layer 132 of pixel-defining material is formed overlying the subpixel regions 103 and the remaining portion 131 (FIG. 19G). A patterning process is performed in the second layer 132 to expose the subpixel region 103 and form edge portion 133 of the second layer (FIG. 19H). Both the remaining portion 131 of the first layer and the edge portion 133 of the second layer together form the pixel-defining layer (e.g., 101 of FIG. 1). The first layer of pixel-defining material and the second layer of pixel-defining material can be the same or different material. Optionally, the first layer 130 includes a material that is opposite in polarity compared to the to-be used ink material so that the ink material in liquid form dripped into the container portion made by the first layer 130 can be substantially free to flow. Optionally, the patterning process used in the embodiment is an etching process. Optionally, the etching process is a dry process. Optionally, the etching process is a wet process.

In yet another aspect, the present disclosure provides a method for fabricating a light-emitting display device. FIG. 20 shows a flow chart of a method for fabricating a light-emitting display device according to some embodiments of the present disclosure. Referring to FIG. 20, the method includes providing a display panel having a pixel-defining layer having a pixel-defining layer including at least one groove. Optionally, the display panel includes all features described in FIG. 1 through FIG. 14 herein. The method further includes forming a hole-injection layer and a hole-transporting layer. Optionally, the hole-injection layer and the hole-transporting layer can be formed by a printing process. The printing process includes a plane printing process including moving multiple nozzles arranged in an array to sequentially drip light-emitting ink materials in liquid form directly into subpixel regions in respective columns. Every row of subpixel regions needs one nozzle that is movable along the row direction. Alternatively, the printing process includes dripping liquid ink material into grooves then flowing into the subpixel regions. Optionally, the hole-injection layer and the hole-transporting layer can be formed by vapor deposition process directly in the subpixel regions.

Referring to FIG. 20, the method further includes forming one type of light-emitting layer overlying the hole-transporting layer in some subpixel regions using liquid ink dripping into at least one groove and having the liquid ink to flow from the at least one groove to the corresponding subpixel regions. In the embodiment, at least one of red light-emitting layer, green light-emitting layer, and blue light-emitting layer is formed using the ink-dripping process described above. The other light-emitting layers can be either by directly dripping liquid ink into the subpixel regions or by vapor deposition. Optionally, forming the red light-emitting layer in each red subpixel region and forming green light-emitting layer in each green subpixel region use the process of dripping liquid ink into respective grooves then making the liquid ink to flow from the grooves into corresponding subpixel regions respectively connected to the grooves.

Optionally, the method of forming one type of light-emitting layer includes forming a red light-emitting layer in some subpixel regions by dripping a red ink material in liquid form into a corresponding container portion that is connected to the some subpixel regions and drying the red ink material therein to solid form. Optionally, the method of forming one type of light-emitting layer also includes forming a green light-emitting layer in some other subpixel regions by dripping a green ink material in liquid form into another corresponding container portion that is connected to the some other subpixel regions and drying the green ink material therein to solid form. The corresponding container portion for receiving the red ink material the and the another corresponding container portion for receiving the green ink material belong to different grooves that are separated in the pixel-defining layer.

Optionally, forming the blue light-emitting layer uses vapor deposition to form a layer of blue light-emitting material on the red light-emitting layer and the green light-emitting layer as a commonly shared blue light-emitting layer. The vapor deposition of the blue light-emitting material is performed after the formation of the red light-emitting layer and the green light-emitting layer. No groove of the pixel-defining layer is employed for forming the blue light-emitting layer so that space for making grooves is saved. Using the ink-dripping method of the present disclosure for forming red and green light emitting layers greatly improves material utilization and printing accuracy. The method may also help to increase the aperture rate for each sub-pixel portion.

Optionally, the method additionally includes forming an electron transporting layer and another electrode. Optionally, the electron transporting layer and another electrode can be formed using vapor deposition method.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel comprising columns of subpixels of a first color, columns of subpixels of a second color, and columns of subpixels of a third color alternately arranged, wherein subpixels in a same column are subpixels of a same color; and subpixels respectively in two adjacent columns are subpixels of different colors;

wherein the display panel comprises a pixel defining layer defining subpixel apertures of subpixels in the display panel; a respective subpixel aperture has an elongated shape; a width of the respective subpixel aperture along a column direction is greater than a width of the respective subpixel aperture along a row direction;

the pixel defining layer is a unitary structure comprising column portions and row portions; a respective row portion is between two adjacent subpixel apertures that are in a same column and respectively from two adjacent rows; a respective column portion is in a space between two adjacent columns of subpixel apertures, spacing apart multiple pairs of adjacent row portions respectively in multiple rows;

the respective row portion comprises a depression part configured to allow fluid communication of an ink solution between the two adjacent subpixel apertures in the same column and respectively from the two adjacent rows; and a minimum height of the depression part relative to a surface of a base substrate is less than a minimum height of a column portion adjacent to the respective row portion relative to the surface of the base substrate.

2. The display panel of claim 1, wherein the respective row portion further a first side part and a second side part respectively on two sides of the depression part;

the first side part, the depression part, and the second side part are consecutively arranged along the row direction;

a minimum height of the respective row portion relative to the surface of the base substrate is less than a minimum height of a column portion adjacent to the respective row portion relative to the surface of the base substrate; and a height of the respective row portion relative to the surface of the base substrate decreases from the first side part toward the depression part, and decreases from the second side part toward the depression part.

3. The display panel of claim 2, wherein the first side part, the second side part, and the depression part are parts of the unitary structure comprising a same pixel defining insulating material.

4. The display panel of claim 2, wherein the first side part, the second side part, the depression part, and the respective column portion are parts of the unitary structure comprising a same pixel defining insulating material.

5. The display panel of claim 1, wherein multiple row portions in the same column and multiple subpixel apertures respectively of multiple subpixels of a same color in the same column are alternately arranged along the column direction; and the multiple row portions respectively comprise multiple depression parts configured to allow fluid communication of an ink solution among the multiple subpixel apertures respectively of the multiple subpixels of the same color in the same column.

6. The display panel of claim 1, further comprising a first light emitting material layer arranged in a plurality of first light emitting material columns;

a respective first light emitting material column of the plurality of light emitting material columns is in subpixel apertures in a same column;

two adjacent first light emitting material columns are spaced apart by the respective column portion; and an orthographic projection of the respective first light emitting material column on the base substrate at least partially overlaps with an orthographic projection on the base substrate of the depression part of the respective row portion between two adjacent subpixel apertures that are in the same column and respectively from two adjacent rows.

7. The display panel of claim 6, further comprising a second light emitting material layer on a side of the first light emitting material layer away from the base substrate; and an orthographic projection of the second light emitting material layer on the base substrate covers orthographic projections of the subpixel apertures defined by the pixel defining layer on the base substrate, and covers orthographic projections of the row portions and the column portions of the pixel defining layer on the base substrate.

8. The display panel of claim 7, wherein the first light emitting material layer comprises one or more of a hole injection layer, a hole transport layer, and a light emitting layer; and the second light emitting material layer comprises an electron transport layer.

9. The display panel of claim 5, wherein the orthographic projection of the respective first light emitting material column on the base substrate at least partially overlaps with each of orthographic projections of the multiple depression parts of the multiple row portions in the same column on the base substrate.

10. The display panel of claim 1, wherein a bottom surface of at least a portion of the depression part is in contact with a top surface of at least a portion of an anode with respect to the surface of the base substrate.

11. The display panel of claim 1, wherein at least a portion of the depression part is on a top surface of an anode.

12. The display panel of claim 1, wherein the subpixel apertures comprise at least one connecting aperture;

two row portions are respectively on two opposite sides of a connecting subpixel aperture;

the two row portions respectively comprise two depression parts arranged along the column direction; and the two depression parts are configured to allow fluid communication of the ink solution between the connecting subpixel aperture and other two adjacent subpixel apertures in the same column, the connecting subpixel aperture and the two adjacent subpixel apertures being respectively from the three consecutively adjacent rows.

13. The display panel of claim 1, further comprising a plurality of anode columns;

a respective anode column of the plurality of anode columns is underneath subpixel apertures in a same column, a portion of the respective anode column being underneath the respective row portion between two adjacent subpixel apertures that are in the same column and respectively from two adjacent rows.

14. The display panel of claim 1, further comprising a plurality of anodes respectively in a plurality of subpixels;

wherein a top surface of at least a portion of a respective anode of the plurality of anodes is in contact with a bottom surface of at least a portion of the row portion, and in contact with a bottom surface of at least a portion of the respective column portion.

15. The display panel of claim 1, further comprising a unitary cathode layer extending throughout a plurality of subpixels; and an orthographic projection of the unitary cathode layer on the base substrate covers orthographic projections of the subpixel apertures defined by the pixel defining layer on the base substrate, and covers orthographic projections of the row portions and the column portions of the pixel defining layer on the base substrate.

16. The display panel of claim 1, wherein a width along the row direction of the respective column portion decreases from a side closer to the base substrate to a side away from the base substrate; and/or a width along the column direction of the respective row portion decreases from a side closer to the base substrate to a side away from the base substrate.

17. The display panel of claim 1, wherein a thickness of the respective column portion is greater than a thickness of a first light emitting material layer in the respective subpixel aperture.

18. The display panel of claim 1, wherein a thickness of the depression part is greater than a thickness of a first light emitting material layer in the respective subpixel aperture.

19. The display panel of claim 1, further comprising:
- a hole injection layer comprising a plurality of hole injection blocks respectively in a plurality of subpixel apertures and spaced apart from each other by the pixel defining layer;
- a hole transport layer comprising a plurality of hole transport blocks respectively in the plurality of subpixel apertures and spaced apart from each other by the pixel defining layer;
- a red light emitting layer comprising a plurality of red light emitting blocks respectively in a plurality of red subpixel apertures and spaced apart from each other by the pixel defining layer; and
- a green light emitting layer comprising a plurality of green light emitting blocks respectively in a plurality of green subpixel apertures and spaced apart from each other by the pixel defining layer.

20. The display panel of claim 1, further comprising:
- a hole injection layer comprising a plurality of hole injection blocks respectively in a plurality of subpixel apertures and spaced apart from each other by the pixel defining layer;
- a hole transport layer comprising a plurality of hole transport blocks respectively in the plurality of subpixel apertures and spaced apart from each other by the pixel defining layer;
- a light emitting layer comprising a plurality of light emitting blocks respectively in the plurality of subpixel apertures and spaced apart from each other by the pixel defining layer;
- a unitary electron transport layer extending throughout a plurality of subpixels; and
- a unitary cathode layer extending throughout the plurality of subpixels.

* * * * *